US008921957B1

(12) United States Patent
Zhang et al.

(10) Patent No.: US 8,921,957 B1
(45) Date of Patent: Dec. 30, 2014

(54) METHOD OF IMPROVING MEMS MICROPHONE MECHANICAL STABILITY

(71) Applicant: Robert Bosch GmbH, Stuttgart (DE)

(72) Inventors: Yujie Zhang, Pittsburgh, PA (US);
Andrew J. Doller, Sharpsburg, PA (US);
Thomas Buck, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/052,509

(22) Filed: Oct. 11, 2013

(51) Int. Cl.
| | | |
|---|---|---|
| *H01L 29/82* | (2006.01) | |
| *H01L 21/00* | (2006.01) | |
| *H04R 25/00* | (2006.01) | |
| *H02N 1/04* | (2006.01) | |
| *B81B 7/00* | (2006.01) | |
| *B81C 1/00* | (2006.01) | |
| *H04R 1/04* | (2006.01) | |
| *H01L 41/00* | (2013.01) | |

(52) U.S. Cl.
CPC ........... *B81B 7/0054* (2013.01); *B81C 1/00666*
(2013.01); *H04R 1/04* (2013.01); *H01L 41/00*
(2013.01)
USPC ................... 257/416; 257/419; 257/E21.613;
257/E29.324; 438/53; 381/174; 310/300

(58) Field of Classification Search
CPC .. B81B 7/0054; B81C 1/00666; H01L 41/00;
H04R 1/04
USPC .................... 438/53; 257/416, 419, E21.613,
257/E29.324; 381/174; 310/300; 29/428
See application file for complete search history.

(56) References Cited

U.S. PATENT DOCUMENTS

| | | |
|---|---|---|
| 7,346,178 B2 | 3/2008 | Zhe et al. |
| 7,834,409 B2 | 11/2010 | Reichenbach et al. |
| 2006/0280319 A1 | 12/2006 | Wang et al. |
| 2010/0158279 A1 | 6/2010 | Conti et al. |
| 2012/0045078 A1 | 2/2012 | Lander |
| 2012/0328132 A1 | 12/2012 | Wang |
| 2013/0016859 A1 | 1/2013 | Buck |
| 2014/0239353 A1* | 8/2014 | Daneman et al. ............. 257/254 |

FOREIGN PATENT DOCUMENTS

WO    0212906    2/2002

OTHER PUBLICATIONS

Miao et al., "Design considerations in micromachined silicon microphones," Microelectronics, Journal vol. 33, Issues 1-2, Jan. 2, 2002, pp. 21-28.

* cited by examiner

*Primary Examiner* — David S Blum
(74) *Attorney, Agent, or Firm* — Michael Best & Friedrich LLP

(57) ABSTRACT

A MEMS microphone. The MEMS microphone includes a back plate, a membrane, a support structure, a substrate, and an overtravel stop. The membrane is coupled to the back plate. The support structure includes a support structure opening and a first side of the support structure is coupled to a second side of the back plate. The substrate includes a substrate opening and a first side of the substrate is coupled to a second side of the support structure. The overtravel stop limits a movement of the membrane away from the back plate and includes at least one of an overtravel stop structure coupled to the substrate, an overtravel stop structure formed as part of a carrier chip, and an overtravel stop structure formed as part of the support structure in the support structure opening.

20 Claims, 12 Drawing Sheets

US 8,921,957 B1

METHOD OF IMPROVING MEMS MICROPHONE MECHANICAL STABILITY

BACKGROUND

The present invention relates to a method improving the mechanical stability of a microelectromechanical ("MEMS") microphone by limiting the movement of a membrane away from a back plate using a type of overtravel stop ("OTS") which is not coupled to the membrane.

Capacitive MEMS microphones are mechanically extremely sensitive devices. They need to operate in a very high dynamic range of 60-80 db (1/1000-1/10000). To create a membrane which is sensitive enough to detect the lowest pressures (~1 mPa), it must be very compliant to pressure changes. At the same time, the membrane must withstand pressures in the range of several 10s of Pascals without being destroyed. This is typically achieved by clamping the membrane between OTSs in both directions. While an OTS towards the back plate (i.e., when the membrane is moving towards the back plate) is relatively easy to realize, the opposite direction (i.e., OTS towards the support structure, when the membrane is moving towards the support structure) either requires another dedicated layer or (typically) uses the support structure as the OTS.

FIG. 1 illustrates a typical capacitive MEMS microphone 100. The MEMS microphone 100 includes a back plate 105, a membrane 110, and a support structure 115. The membrane 110 is coupled to the back plate 105 at point 120 (the membrane 110 is insulated from the back plate 105 as they are at different electrical potentials). Sound waves passing through the back plate 105 cause the membrane 110 to vibrate up (in the direction of arrow 125) and down (in the direction of arrow 130). To prevent the membrane 110 from traveling too far toward the back plate 105, shorting the membrane 110 to the back plate 105, OTSs 135 are provided at both ends of the membrane 110. Each OTS 135 is sometimes referred to as "an OTS toward the back plate." In addition, the support structure 115 itself provides a second OTS ("an OTS toward the support structure").

During microphone operation, a high bias voltage (e.g., 1 to 40 V) is typically applied between the membrane 110 and the back plate 105. To avoid a short and potential destruction of the electronics, or the MEMS structure itself, series resistors or insulating layers on top of the OTS bumps are required. The use of series resistors requires careful design of the electronics, and the use of insulating layers increases the complexity/cost of the device significantly and may even be impossible due to process constraints. In addition, an insulating layer on top of the bumps is not an ideal solution as long as the membrane and the OTS bump are on different electrical potentials. In this case, electrostatic forces can decrease the pull-in voltage and/or provide sufficient force to keep the membrane 110 stuck to the back plate 105 after contact due to overload. Additional circuitry may be required to detect this and switch off the bias voltage to allow the membrane 110 to release from the back plate 105.

Creating the OTS towards the support structure is especially difficult. Due to processing tolerances during the backside processing, which typically incorporates a high rate trench, accommodations must be made to compensate for possible misalignment. FIG. 2 shows how the trench can vary from the frontside 200 to the backside 205. To accommodate for the typical misalignment 210 between the frontside 200 and the backside 205, the membrane 110 and the support structure 115 have a large, e.g., several microns, overlap. Additionally, the variation of the backside trench leads to a large variation at the deep end of the trench, and adds to the overall tolerances (several tens of microns). The accuracy of the backside trench can be improved at the cost of processing time. Longer processing increases the device's cost.

Overlapping of the membrane 110 and the support structure 115 results in a significant and varying parasitic capacitance which directly influences the final sensitivity of the sensor element. Accordingly, it is important to keep the overlap of the membrane 110 and the support structure 115 to a minimum.

SUMMARY

In one embodiment, the invention provides a MEMS microphone. The MEMS microphone includes a back plate that has a first side and a second side, a membrane that has a first side and a second side, a support structure that has a first side and a second side, a substrate that has a first side and a second side, and an overtravel stop. The membrane is coupled to the back plate. The support structure includes a support structure opening and the first side of the support structure is coupled to the second side of the back plate. The substrate includes a substrate opening and the first side of the substrate is coupled to the second side of the support structure. The overtravel stop limits a movement of the membrane away from the back plate and includes at least one of an overtravel stop structure coupled to the substrate, an overtravel stop structure formed as part of a carrier chip, and an overtravel stop structure formed as part of the support structure in the support structure opening. The overtravel stop structure has a first side and a second side.

In another embodiment the invention provides a method of providing mechanical stability to a MEMS microphone. The MEMS microphone includes a back plate that has a first side and a second side, a membrane that has a first side and a second side, a support structure that has a first side and a second side, a substrate that has a first side and a second side, and an overtravel stop. The method includes coupling the membrane to the back plate, coupling the first side of a support structure to the second side of the back plate, coupling the support structure to the substrate, and coupling the overtravel stop to the MEMS microphone. The support structure includes a support structure opening. The substrate includes a substrate opening. The overtravel stop limits the movement of the membrane away from the back plate and includes at least one of an overtravel stop structure coupled to the substrate, an overtravel stop structure formed as part of a carrier chip, and an overtravel stop structure formed as part of the support structure in the support structure opening. The overtravel stop structure has a first side and a second side.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
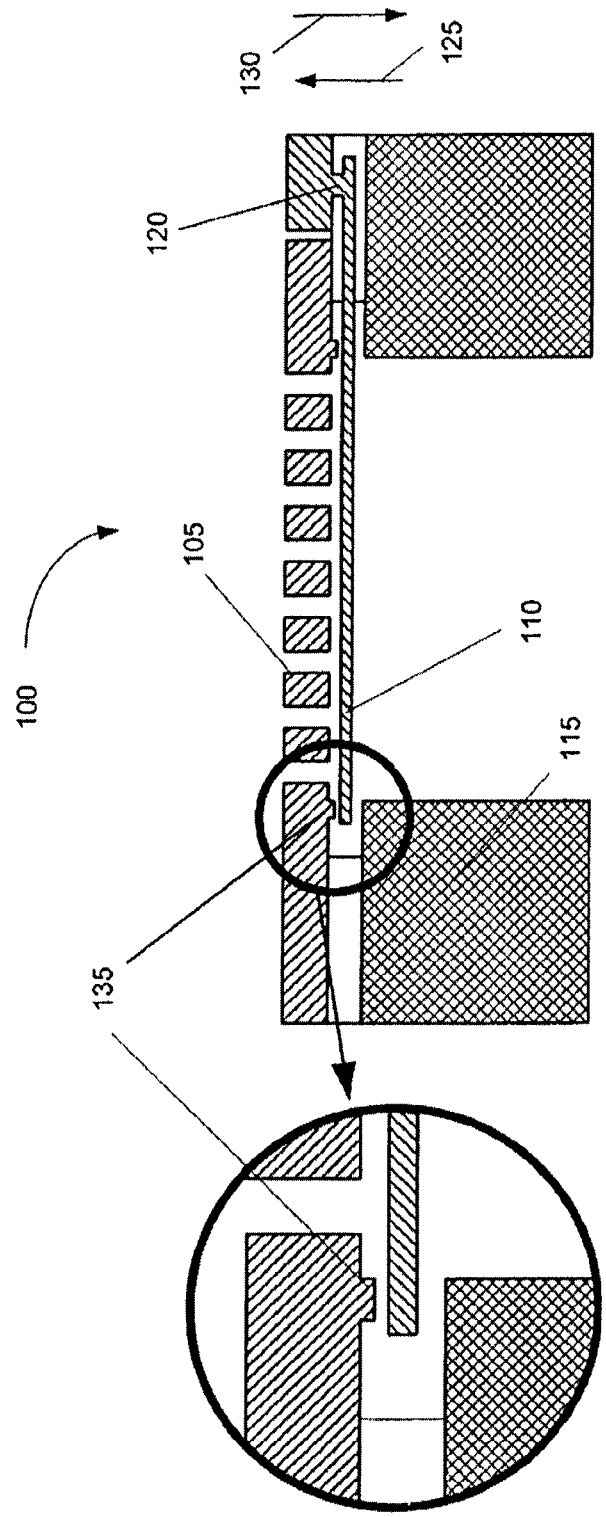
FIG. 1 illustrates a cross-section side view of a prior-art MEMS microphone.
Figure 2:
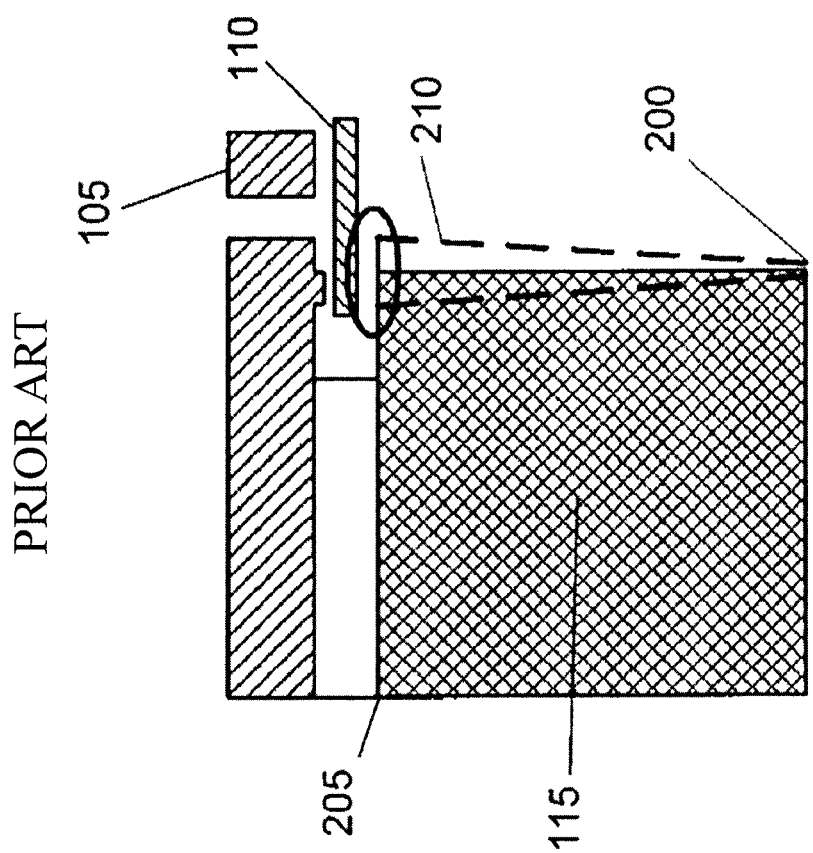
FIG. 2 illustrates a cross-section side view of a prior-art MEMS microphone showing variations of a backside trench forming an OTS.
Figure 3A:
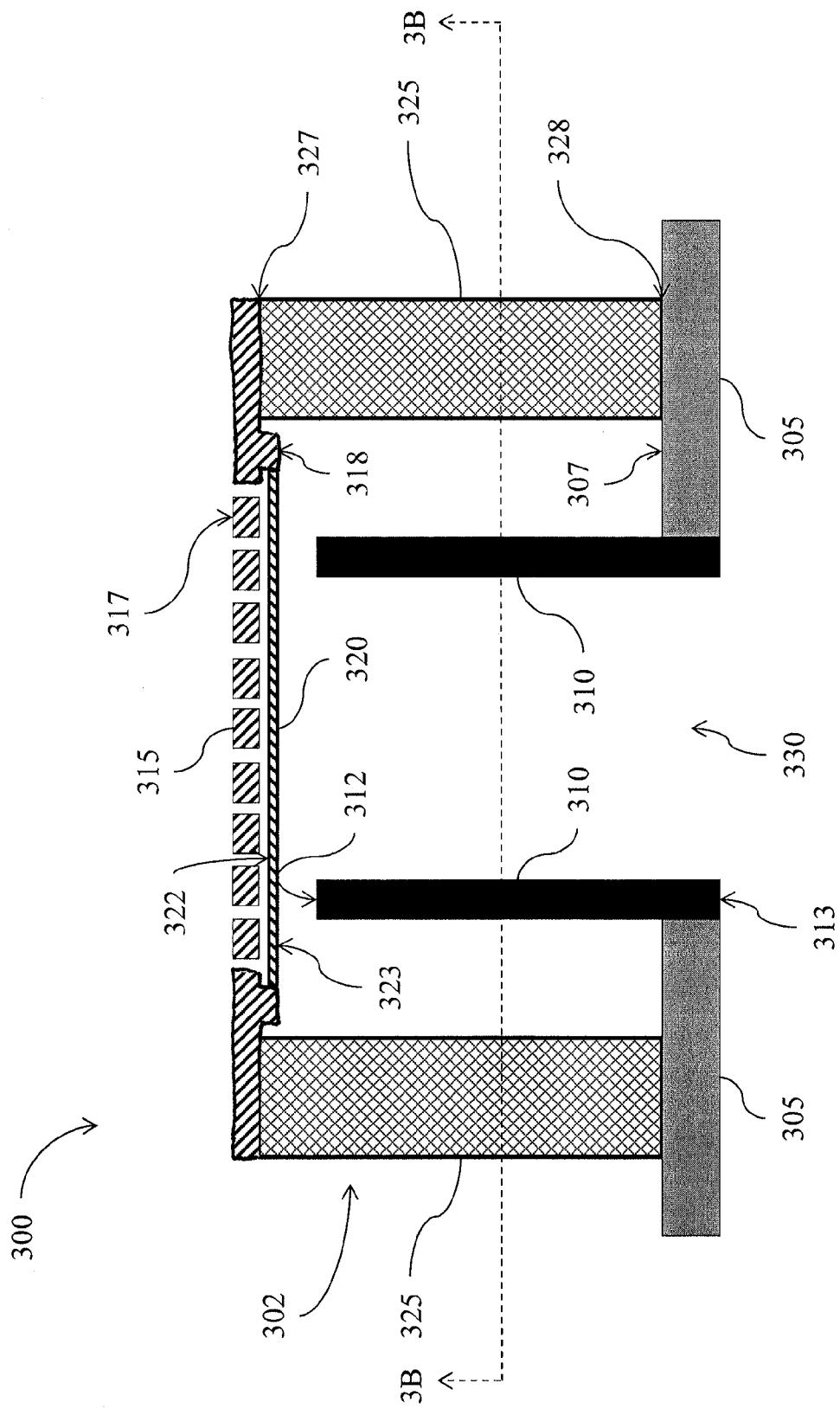
FIG. 3A illustrates a cross-section side view of a MEMS microphone, according to a first embodiment of the invention.

FIG. 3A illustrates a cross-section side view of a MEMS microphone 300, according to a first embodiment of the invention. The MEMS microphone 300 includes a MEMS chip 302, a substrate 305 having a first side 307, and an OTS structure 310 having a first side 312 and a second side 313. The MEMS chip 302 includes a back plate 315 having a first side 317 and a second side 318, a membrane 320 having a first side 322 and a second side 323, and a support structure 325 having a first side 327 and a second side 328. The first side of the membrane 322 is coupled to the second side of the back plate 318. The first side of the support structure 327 is also coupled to the second side of the back plate 318. The first side of the substrate 307 is coupled to the second side of the support structure 328. The substrate 305 includes a substrate opening 330. The second side of the OTS structure 313 is coupled to the substrate 305 and is located in the substrate opening 330. The first side of the OTS structure 312 is positioned a predetermined distance away from the second side of the membrane 323 and prevents the membrane 320 from traveling beyond the predetermined distance in a direction that is away from the back plate 315.

Figure 3B:
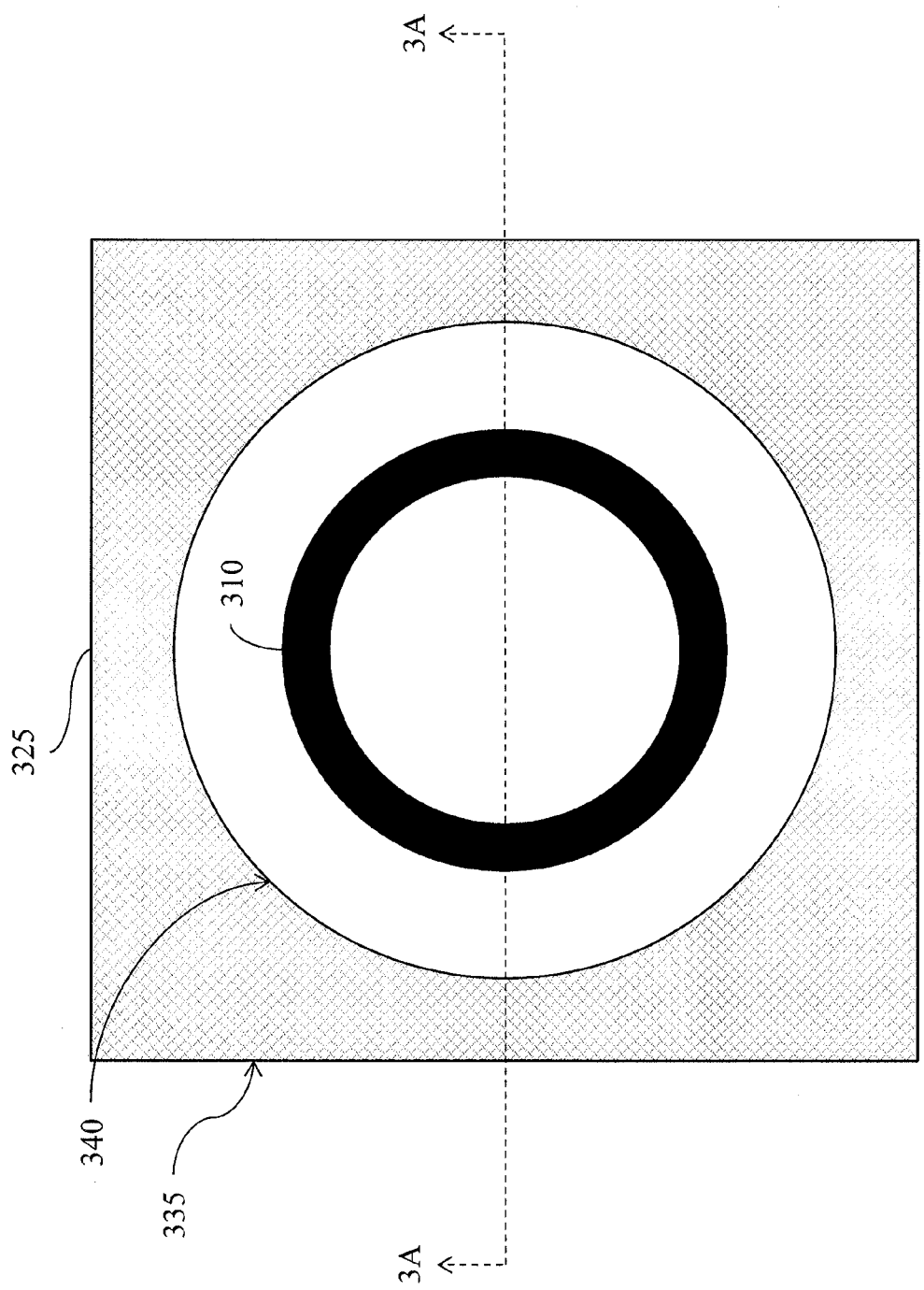
FIG. 3B illustrates a cross-section bottom view of an OTS structure and a support structure, according to a first embodiment of the invention.

FIG. 3B illustrates a cross-section bottom view of the OTS structure 310 and the support structure 325, according to the first embodiment of the invention. For illustrative purposes, the substrate 305, the back plate 315, and the membrane 320 are not included in FIG. 3B. In this embodiment, an outer shape of the support structure 335 is a square and an inner shape of the support structure 340 is a hollow cylinder. In other embodiments, the outer shape of the support structure 335 and the inner shape of the support structure 340 may be different shapes. In this embodiment, the OTS structure 310 is a hollow pillar. In other embodiments, the OTS structure 310 may be different shapes.

Figure 4A:
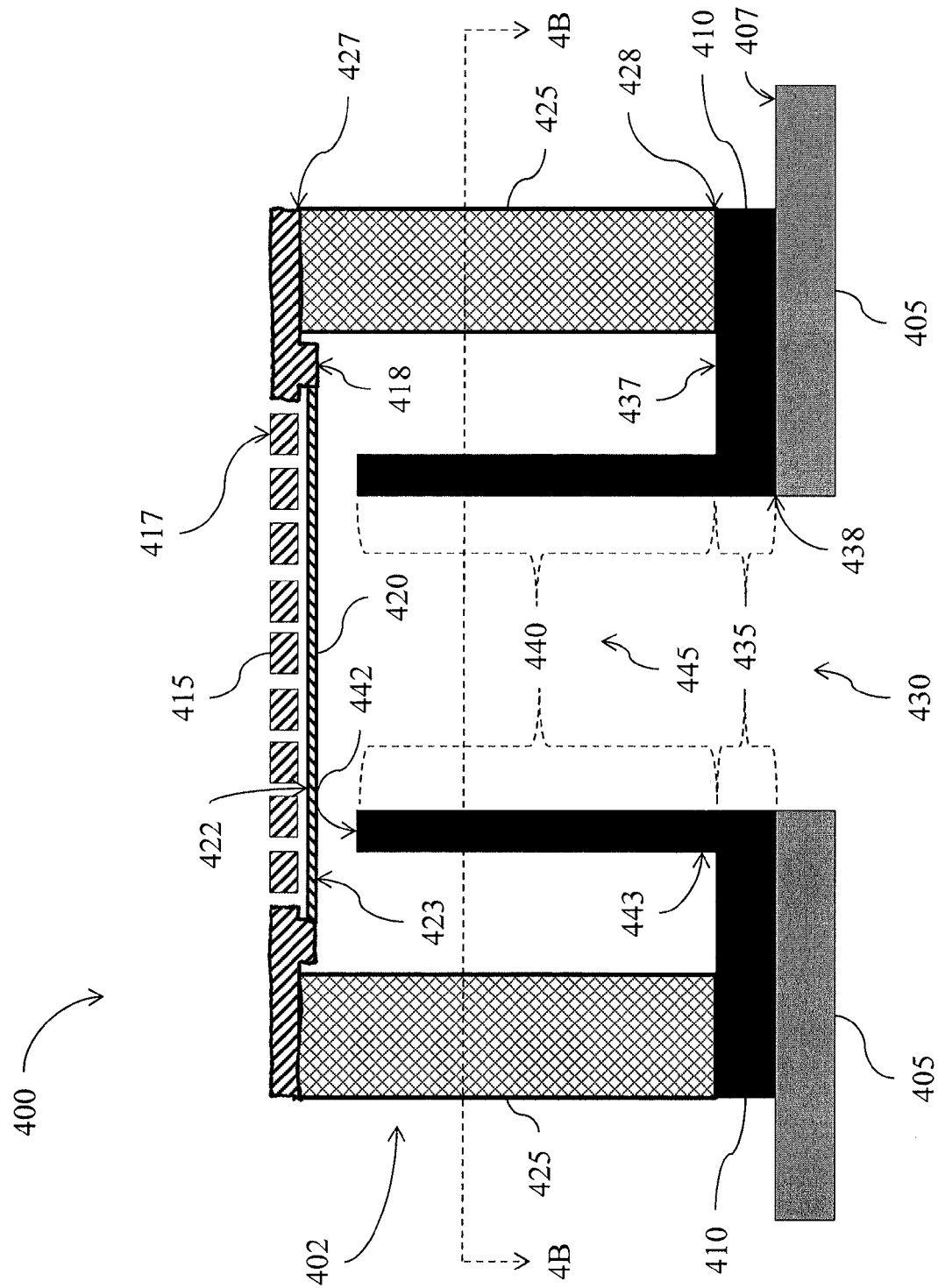
FIG. 4A illustrates a cross-section side view of a MEMS microphone, according to a second embodiment of the invention.

FIG. 4A illustrates a cross-section side view of a MEMS microphone 400, according to a second embodiment of the invention. The MEMS microphone 400 includes a MEMS chip 402, a substrate 405 having a first side 407, and an OTS carrier chip 410. The MEMS chip 402 includes a back plate 415 having a first side 417 and a second side 418, a membrane 420 having a first side 422 and a second side 423, and a support structure 425 having a first side 427 and a second side 428. The substrate 405 includes a substrate opening 430. The OTS carrier chip 410 includes a base structure 435 having a first side 437 and a second side 438, and an OTS structure 440 having a first side 442 and a second side 443. The first side of the membrane 422 is coupled to the second side of the back plate 418. The first side of the support structure 427 is also coupled to the second side of the back plate 418. The first side of the base structure 437 is coupled to the second side of the support structure 428 and is positioned so that the OTS structure 440 is located inside the hollow area of the support structure 425. The first side of the substrate 407 is coupled to the second side of the base structure 438. The first side of the OTS structure 442 is positioned a predetermined distance away from the second side of the membrane 423 and prevents the membrane 420 from traveling beyond the predetermined distance in a direction that is away from the back plate 415. The OTS structure 440 includes an acoustic opening 445. The acoustic opening 445 allow sound waves to travel between the first side 442 and the second side 443 of the OTS structure 440 and impact the second side of the membrane 423.

Figure 4B:
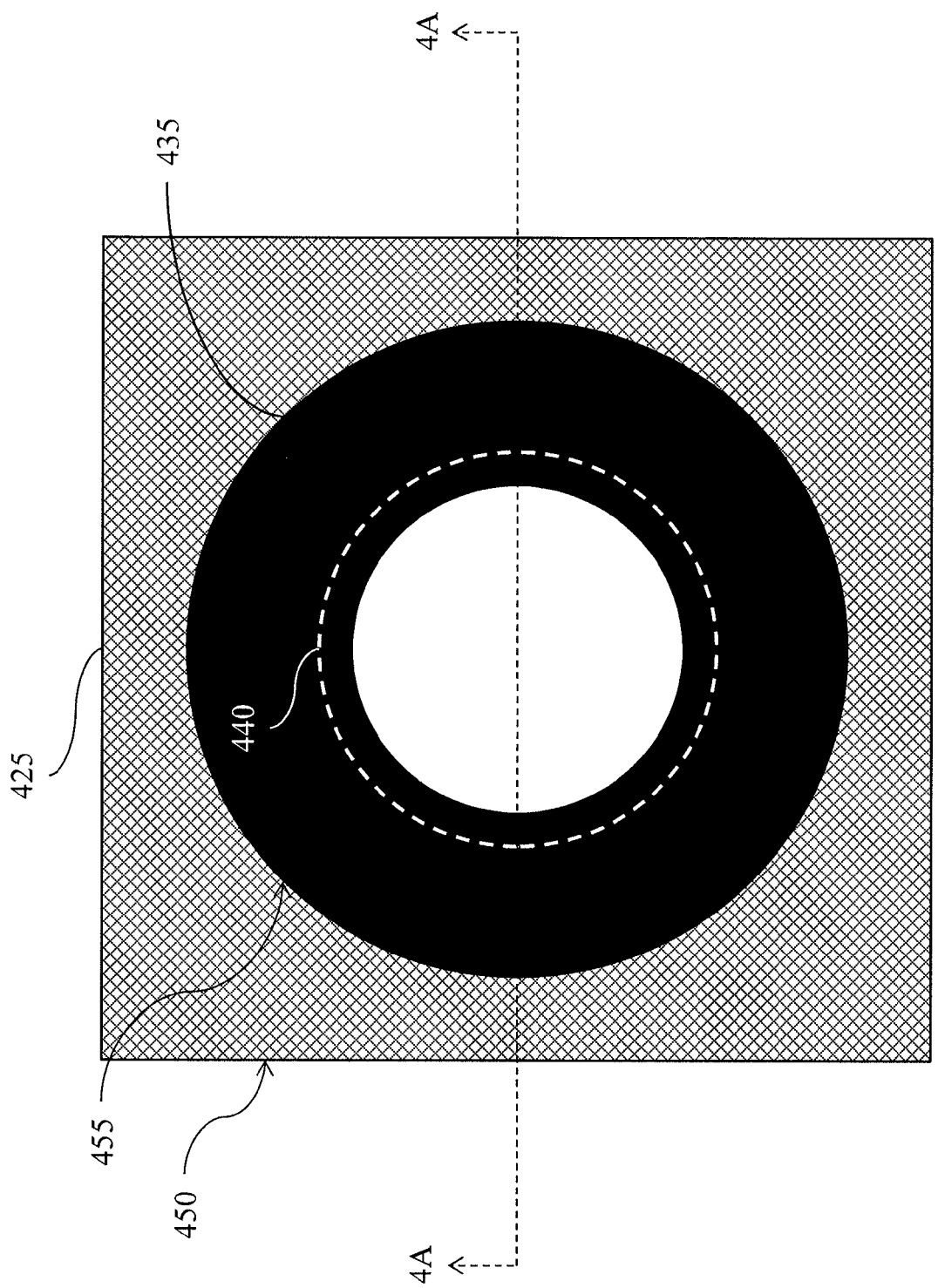
FIG. 4B illustrates a cross-section top view of a support structure, a base structure, and an OTS structure, according to a second embodiment of the invention.

FIG. 4B illustrates a cross-section top view of the support structure 425, the base structure 435, and the OTS structure 440, according to the second embodiment of the invention. For illustrative purposes, the substrate 405, the back plate 415, and the membrane 420 are not included in FIG. 4B. In this embodiment, the outer shape of the support structure 450 is a square and the inner shape of the support structure 455 is a hollow cylinder. In other embodiments, the outer shape of the support structure 450 and inner shape of the support structure 455 may be different shapes. In this embodiment, the OTS structure 440 is a hollow pillar. In other embodiments, the OTS structure 440 may be different shapes.

Figure 4C:
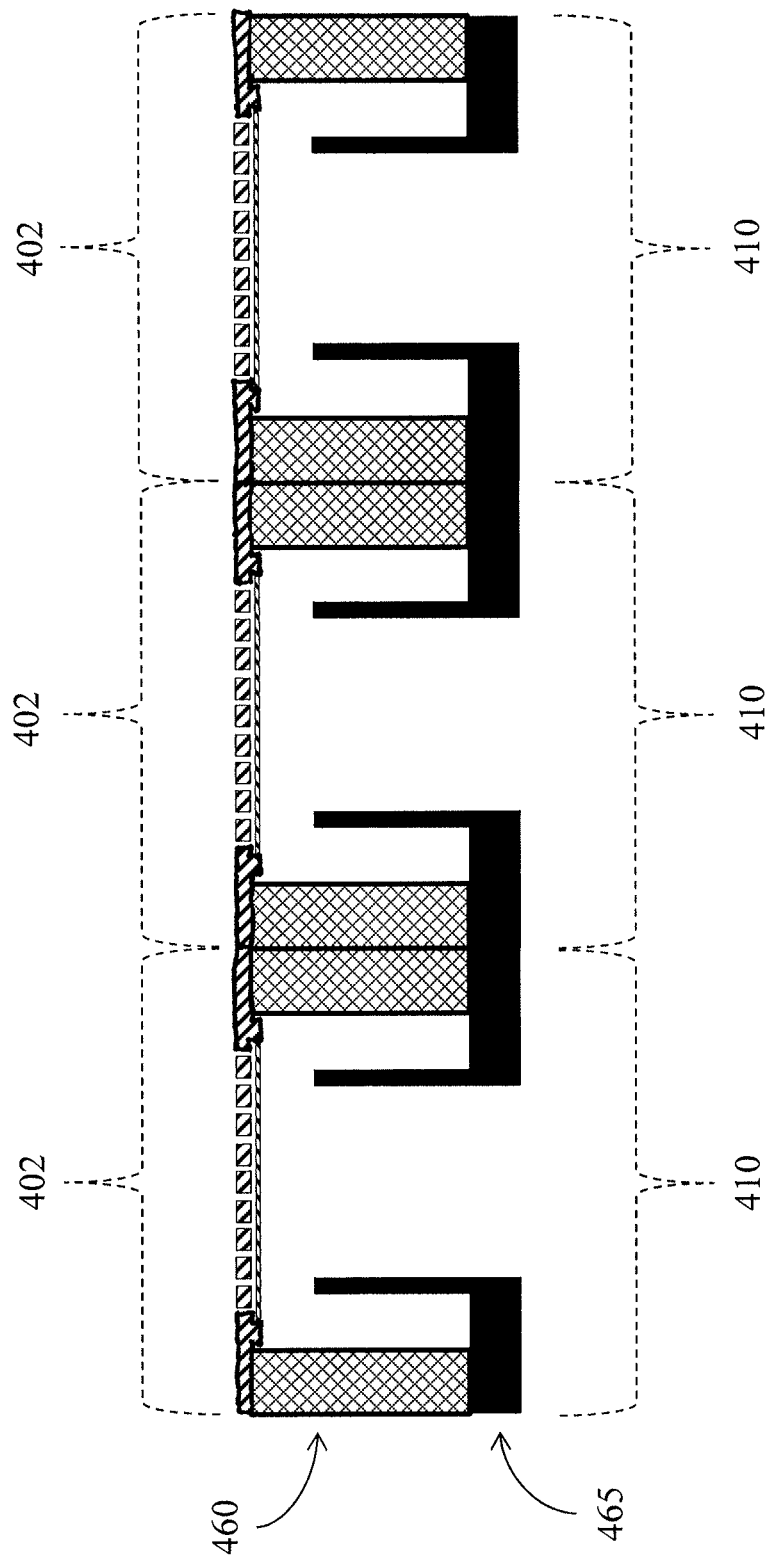
FIG. 4C illustrates a cross-section side view of a MEMS wafer and an OTS carrier wafer, according to a third embodiment of the invention.

FIG. 4C illustrates a cross-section side view of a MEMS wafer 460 and an OTS carrier wafer 465, according to a third embodiment of the invention. The MEMS wafer 460 includes a plurality of MEMS chips 402. The OTS carrier wafer 465 includes a plurality of OTS carrier chips 410. The MEMS wafer 460 and the OTS carrier wafer 465 are bonded together to form a plurality of MEMS microphones 400. This bonding is a MEMS process.

Figure 5A:
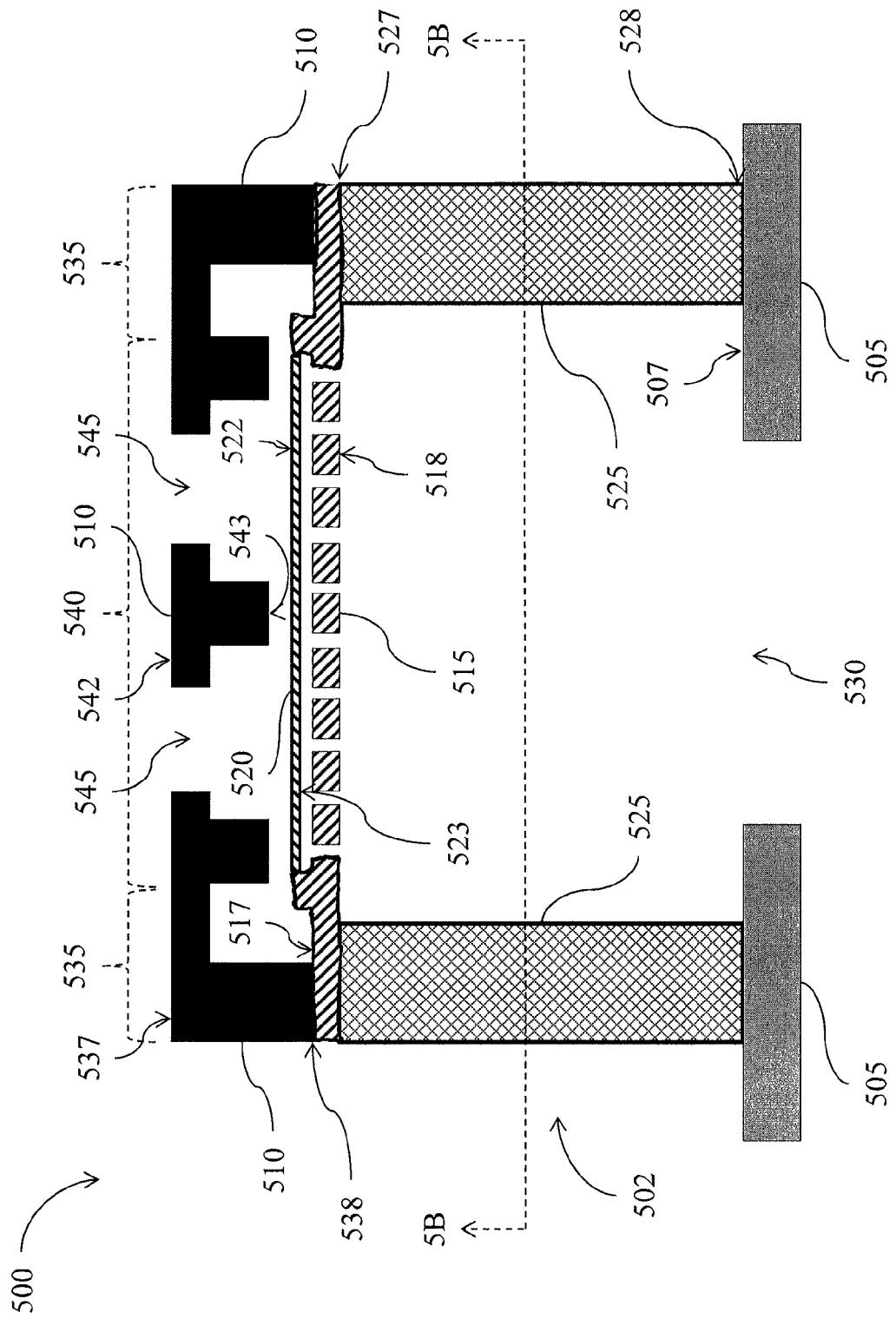
FIG. 5A illustrates a cross-section side view of a MEMS microphone, according to a forth embodiment of the invention.

FIG. 5A illustrates a cross-section side view of a MEMS microphone 500, according to a fourth embodiment of the invention. The MEMS microphone 500 includes a MEMS chip 502, a substrate 505 having a first side 507, and an OTS carrier chip 510. The MEMS chip 502 includes a back plate 515 having a first side 517 and a second side 518, a membrane 520 having a first side 522 and a second side 523, and a support structure 525 having a first side 527 and a second side 528. The substrate 505 includes a substrate opening 530. The OTS carrier chip 510 includes a base structure 535 having a first side 537 and a second side 538 and an OTS structure 540 having a first side 542 and a second side 543. The first side of the back plate 517 is coupled to the second side of the membrane 523. The first side of the support structure 527 is coupled to the second side of the back plate 518. The first side of the substrate 507 is coupled to the second side of the support structure 528. The first side of the back plate 513 is coupled to the second side of the base structure 538. The second side of the OTS structure 543 is positioned a predetermined distance away from the first side of the membrane 522 and prevents the membrane 520 from traveling beyond the predetermined distance in a direction that is away from the back plate 515. The OTS structure 540 includes a plurality of acoustic openings 545. The plurality of acoustic openings 545 allow sound waves to travel between the first side 542 and the second side 543 of the OTS structure 540 and impact the first side of the membrane 522.

Figure 5B:
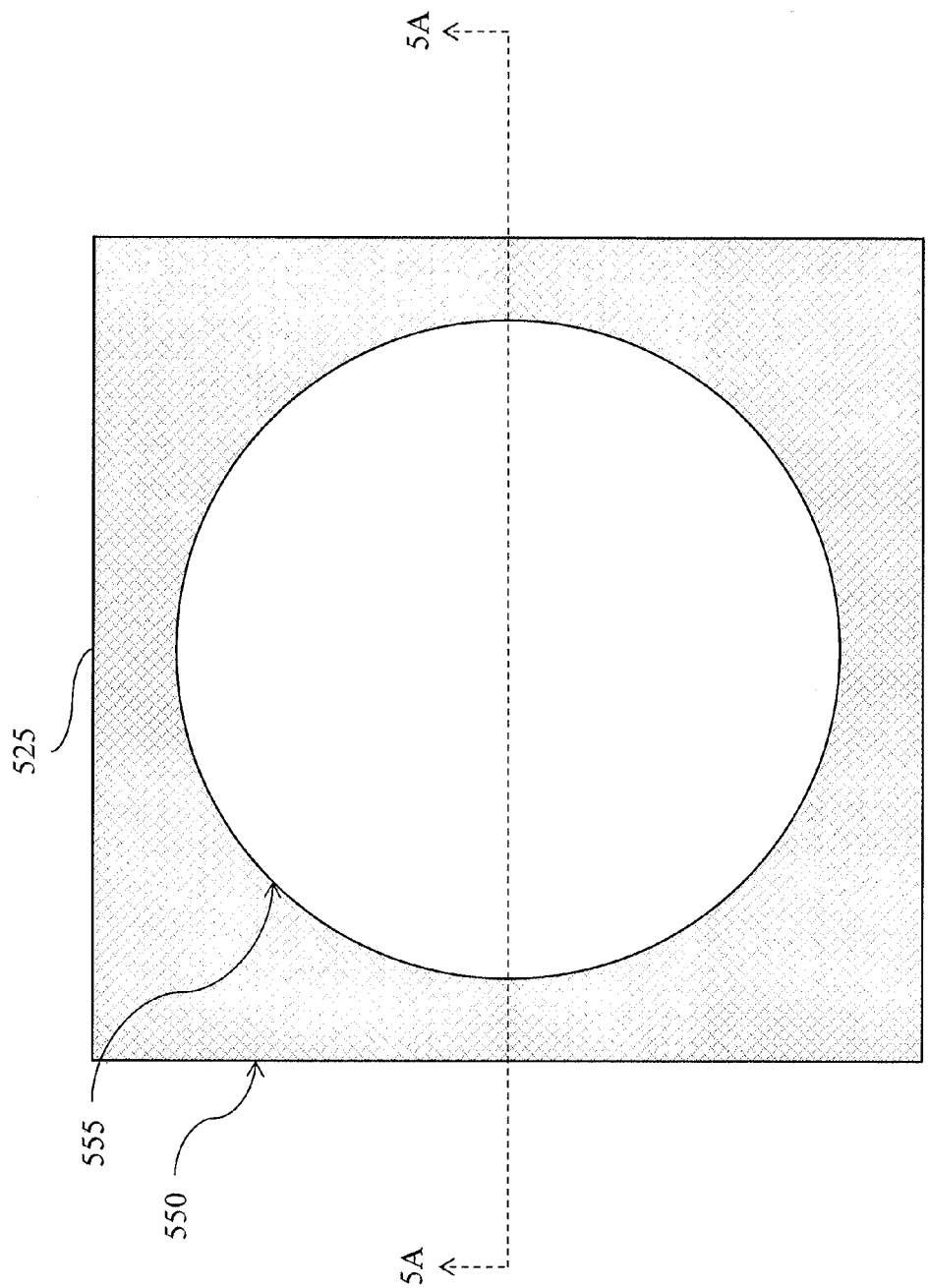
FIG. 5B illustrates a cross-section bottom view of a support structure, according to a forth embodiment of the invention.

FIG. 5B illustrates a cross-section bottom view of the support structure 525, according to the fourth embodiment of the invention. For illustrative purposes, the substrate 505, the OTS carrier chip 510, the back plate 515, and the membrane 520 are not included in FIG. 5B. In this embodiment, an outer shape of the support structure 550 is a square and an inner shape of the support structure 555 is a hollow cylinder. In other embodiments, the outer shape of the support structure 550 and the inner shape of the support structure 555 may be different shapes.

Figure 5C:
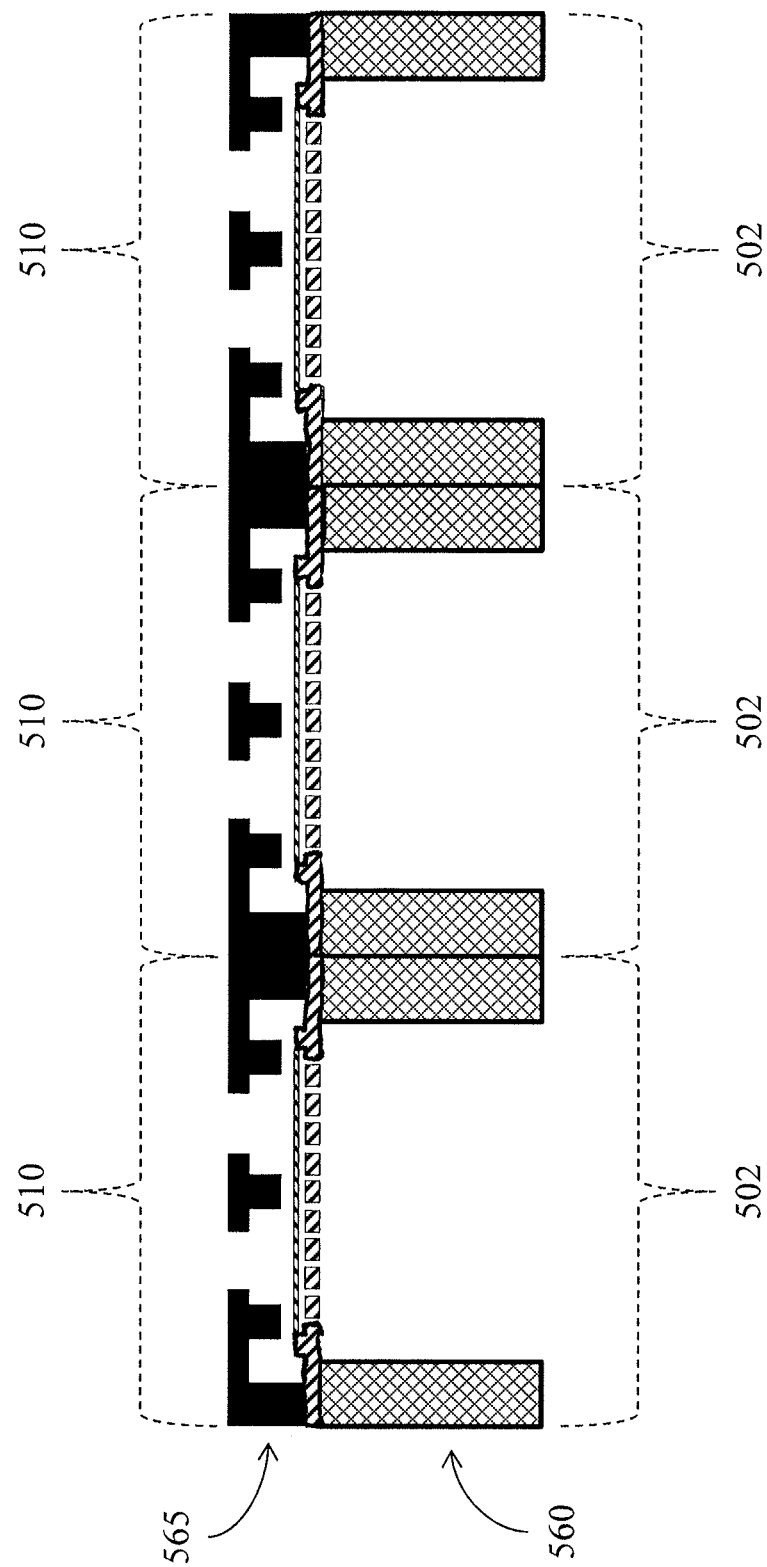
FIG. 5C illustrates a cross-section side view of a MEMS wafer and an OTS carrier wafer, according to a fifth embodiment of the invention.

FIG. 5C illustrates a cross-section side view of a MEMS wafer 560 and an OTS carrier wafer 565, according to a fifth embodiment of the invention. The MEMS wafer 560 includes a plurality of MEMS chips 502. The OTS carrier wafer 565 includes a plurality of OTS carrier chips 510. The MEMS wafer 560 and the OTS carrier wafer 565 are bonded together to form a plurality of MEMS microphones 500. This bonding is a MEMS process.

Figure 6A:
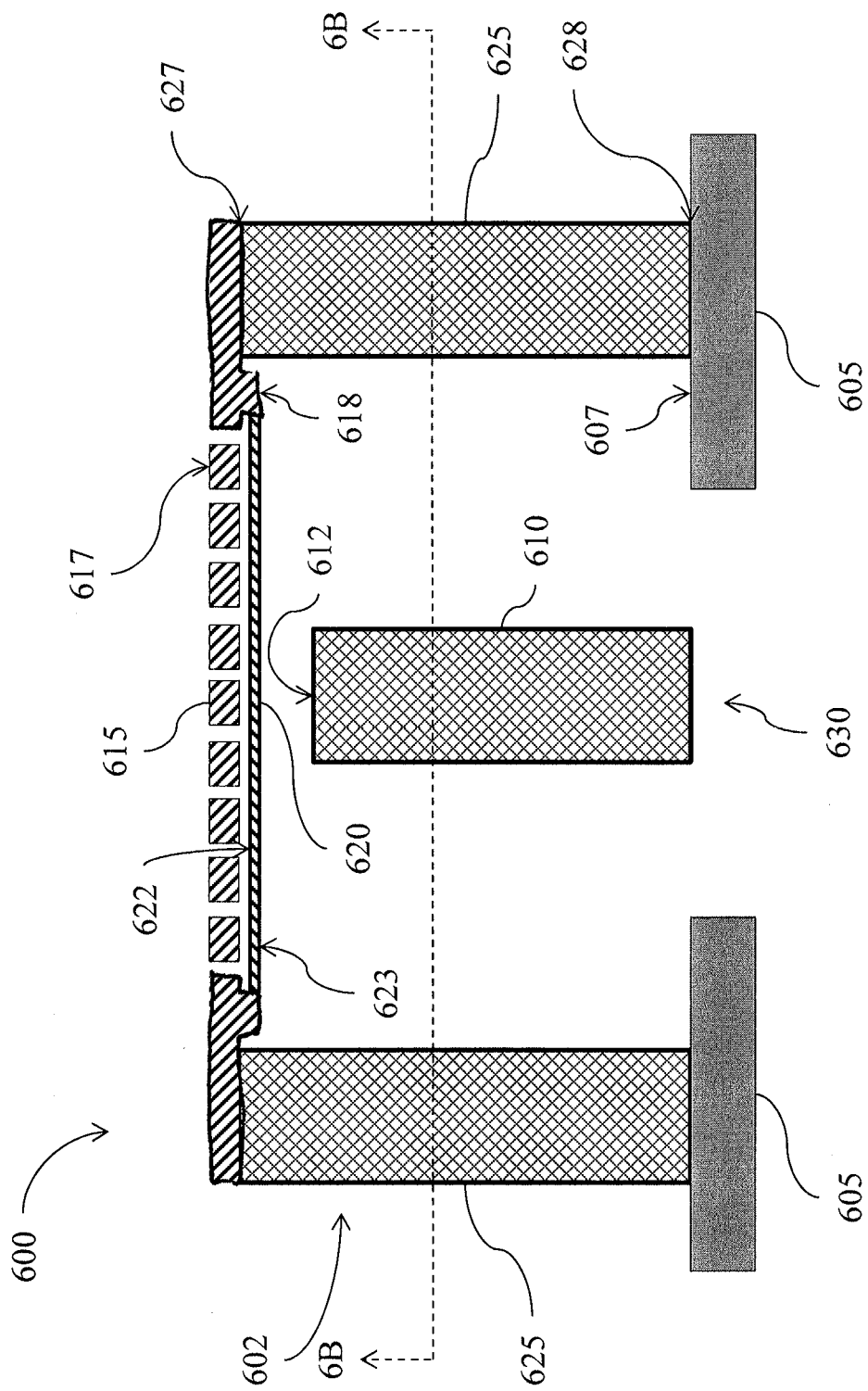
FIG. 6A illustrates a cross-section side view of a MEMS microphone, according to a sixth embodiment of the invention.

FIG. 6A illustrates a cross-section side view of a MEMS microphone 600, according to a sixth embodiment of the invention. The MEMS microphone 600 includes a MEMS chip 602, a substrate 605 having a first side 607, and an OTS structure 610 having a first side 612. The MEMS chip 602 includes a back plate 615 having a first side 617 and a second side 618, a membrane 620 having a first side 622 and a second side 623, and a support structure 625 having a first side 627 and a second side 628. The first side of the membrane 622 is coupled to the second side of the back plate 618. The first side of the support structure 627 is also coupled to the second side of the back plate 618. The first side of the substrate 607 is coupled to the second side of the support structure 628. The substrate 605 includes a substrate opening 630. The OTS structure 610 is part of the support structure 625. The OTS structure 610 is generated by using a pattern during the formation of a backside trench of the support structure 625. The first side of the OTS structure 612 is positioned a predetermined distance away from the second side of the membrane 623 and prevents the membrane 620 from traveling beyond the predetermined distance in a direction that is away from the back plate 615.

Figure 6B:
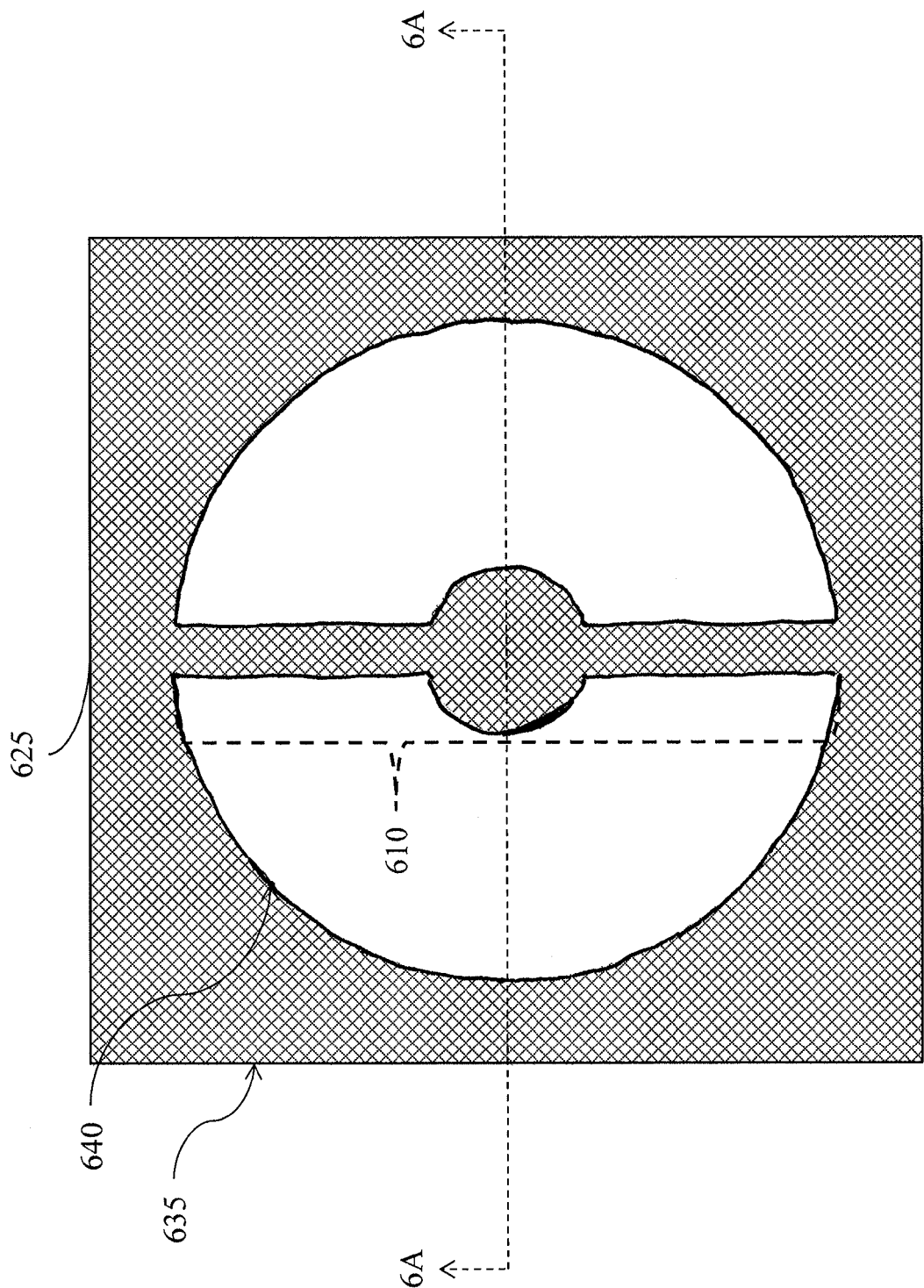
FIG. 6B illustrates a cross-section bottom view of a support structure that includes an OTS structure, according to a sixth embodiment of the invention.

FIG. 6B illustrates a cross-section bottom view of the support structure 625 that includes the OTS structure 610, according to the sixth embodiment of the invention. For illustrative purposes, the substrate 605, the back plate 615, and the membrane 620 are not included in FIG. 6B. In this embodiment, an outer shape of the support structure 635 is a square and an inner shape of the support structure 640 is a hollow cylinder. In other embodiments, the outer shape of the support structure 635 and the inner shape of the support structure 640 may be different shapes. The inner shape of the support structure 640 includes the OTS structure 610. The OTS structure 610 bisects the inner shape of the support structure 640. The pattern of the OTS structure 610 illustrated in FIG. 6B is an example of one possible pattern, used in this embodiment of the invention. It is to be understood that different patterns may be used in other embodiments of the invention.

The specific layouts, component, and manufacturing techniques described above are exemplary and are capable of different implementations. As used above, the term "OTS carrier" may refer to or include silicon, stamped metal, and liquid injected molded plastic.

Thus, the invention provides among other things, a MEMS microphone and a method of providing mechanical stability to the MEMS microphone with an OTS structure. Various features and advantages of the invention are set forth in the following claims.

What is claimed is:

1. A MEMS microphone, the MEMS microphone comprising:
    a back plate having a first side and a second side;
    a membrane coupled to the back plate, and having a first side and a second side;
    a support structure having a first side and a second side, the support structure including a support structure opening, wherein the first side of the support structure is coupled to the second side of the back plate;
    a substrate having a first side and a second side, the substrate including a substrate opening, wherein the first side of the substrate is coupled to the second side of the support structure; and
    an overtravel stop, wherein the overtravel stop limits a movement of the membrane away from back plate and including at least one of
        an overtravel stop structure coupled to the substrate,
        an overtravel stop structure formed as part of a carrier chip, and
        an overtravel stop structure formed as part of the support structure in the support structure opening,
    wherein the overtravel stop structure having a first side and a second side.

2. The MEMS microphone of claim 1, wherein the first side of the membrane is coupled to the second side of the back plate.

3. The MEMS microphone of claim 2, wherein the first side of the overtravel stop structure is positioned a predetermined distance from the second side of the membrane.

4. The MEMS microphone of claim 3, wherein the overtravel stop structure including an acoustic opening that allows sound waves to travel between the first side of the overtravel stop structure and the second side of the overtravel stop structure.

5. The MEMS microphone of claim 4, wherein the second side of the overtravel stop structure is coupled to the first side of the substrate and positioned in the substrate opening.

6. The MEMS microphone of claim 4, wherein
    the overtravel stop structure is formed as part of the carrier chip; and
    the carrier chip including a base structure having a first side and a second side.

7. The MEMS microphone of claim 6, wherein
    the second side of the overtravel stop structure is coupled to the base structure;
    the first side of the base structure is coupled to the second side of the support structure; and
    the second side of the base structure is coupled to the first side of the substrate.

8. The MEMS microphone of claim 3, wherein the overtravel stop structure is formed as part of the support structure in the support structure opening.

9. The MEMS microphone of claim 1, wherein the first side of the back plate is coupled to the second side of the membrane.

10. The MEMS microphone of claim 9, wherein
    the overtravel stop structure is formed as part of the carrier chip;

the carrier chip including a base structure having a first side and a second side;

the overtravel stop structure including a plurality of acoustic openings that allow sound waves to travel between the first side of the overtravel stop structure and the second side of the overtravel stop structure;

the second side of the overtravel stop structure is positioned a predetermined distance from the first side of the membrane; and the first side of the back plate is coupled to the second side of the base structure.

11. A method of providing mechanical stability to a MEMS microphone, the MEMS microphone including a back plate having a first side and a second side, a membrane having a first side and a second side, a support structure having a first side and a second side, a substrate having a first side and a second side, and an overtravel stop, the method comprising:

coupling the membrane to the back plate;

coupling the first side of the support structure to the second side of the back plate, wherein the support structure including a support structure opening;

coupling the support structure to the substrate, wherein the substrate including a substrate opening; and coupling the overtravel stop to the MEMS microphone, wherein the overtravel stop limits a movement of the membrane away from the back plate and including at least one of an overtravel stop structure coupled to the substrate, an overtravel stop structure formed as part of a carrier chip, and an overtravel stop structure formed as part of the support structure in the support structure opening, wherein the overtravel stop structure having a first side and a second side.

12. The method of claim 11, wherein the first side of the membrane is coupled to the second side of the back plate.

13. The method of claim 12, wherein the first side of the overtravel stop structure is positioned a predetermined distance from the second side of the membrane.

14. The method of claim 13, wherein the overtravel stop structure including an acoustic opening that allows sound waves to travel between the first side of the overtravel stop structure and the second side of the overtravel stop structure.

15. The method of claim 14, wherein the second side of the overtravel stop structure is coupled to the first side of the substrate and positioned in the substrate opening.

16. The method of claim 14, wherein the overtravel stop structure is formed as part of the carrier chip; and the carrier chip including a base structure having a first side and a second side.

17. The method of claim 16, wherein the second side of the overtravel stop structure is coupled to the base structure;

the first side of the base structure is coupled to the second side of the support structure; and the second side of the base structure is coupled to the first side of the substrate.

18. The method of claim 13, wherein the overtravel stop structure is formed as part of the support structure in the support structure opening.

19. The method of claim 11, wherein the first side of the back plate is coupled to the second side of the membrane.

20. The method of claim 19, wherein the overtravel stop structure is formed as part of the carrier chip;

the carrier chip including a base structure having a first side and a second side;

the overtravel stop structure including a plurality of acoustic openings that allow sound waves to travel between the first side of the overtravel stop structure and the second side of the overtravel stop structure;

the second side of the overtravel stop structure is positioned a predetermined distance from the first side of the membrane; and the first side of the back plate is coupled to the second side of the base structure.

\* \* \* \* \*